(12) United States Patent
Matsumoto et al.

(10) Patent No.: US 7,403,397 B2
(45) Date of Patent: Jul. 22, 2008

(54) SWITCHING POWER-SUPPLY MODULE

(75) Inventors: Tadahiko Matsumoto, Yokohama (JP); Syuichi Honda, Kawasaki (JP); Yasuo Ohashi, Tokyo-to (JP); Naoto Sano, Yokohama (JP)

(73) Assignee: Murata Manufacturing Co., Ltd, Kyoto (JP)

(*) Notice: Subject to any disclaimer, the term of this patent is extended or adjusted under 35 U.S.C. 154(b) by 659 days.

(21) Appl. No.: 10/746,660

(22) Filed: Dec. 26, 2003

(65) Prior Publication Data

US 2005/0189566 A1    Sep. 1, 2005

(30) Foreign Application Priority Data

Dec. 27, 2002  (JP) ............................. 2002-380193
Oct. 24, 2003  (JP) ............................. 2003-364923

(51) Int. Cl.
*H05K 1/14*  (2006.01)
(52) U.S. Cl. ...................................... 361/792; 361/803
(58) Field of Classification Search ................. 361/792, 361/716, 728, 735, 790, 803; 439/74; 257/200, 257/723, 777–780
See application file for complete search history.

(56) References Cited

U.S. PATENT DOCUMENTS

| | | | | |
|---|---|---|---|---|
| 4,571,663 A | * | 2/1986 | McPherson | 361/735 |
| 5,079,835 A | * | 1/1992 | Lam | 29/840 |
| 5,446,620 A | * | 8/1995 | Burns et al. | 361/704 |
| 5,754,408 A | * | 5/1998 | Derouiche | 361/773 |
| 5,847,985 A | * | 12/1998 | Mitani et al. | 365/63 |
| 6,005,778 A | * | 12/1999 | Spielberger et al. | 361/770 |
| 6,487,078 B2 | * | 11/2002 | Kledzik et al. | 361/704 |
| 6,545,868 B1 | * | 4/2003 | Kledzik et al. | 361/704 |
| 6,621,155 B1 | * | 9/2003 | Perino et al. | 257/686 |
| 6,801,440 B2 | * | 10/2004 | Inoue et al. | 361/803 |

FOREIGN PATENT DOCUMENTS

| | | |
|---|---|---|
| JP | 2-111065 U | 9/1990 |
| JP | 6-61404 A | 3/1994 |
| JP | 7-89191 A | 4/1995 |
| JP | 2002-058247 | 2/2002 |

OTHER PUBLICATIONS

Official communication issued in counterpart Japanese Application No. 2003-364923, mailed of Dec. 25, 2007.

* cited by examiner

*Primary Examiner*—Dean A. Reichard
*Assistant Examiner*—Abiy Getachew
(74) *Attorney, Agent, or Firm*—Keating & Bennett, LLP

(57) ABSTRACT

A switching power-supply module includes circuit boards, power conversion circuit sections provided on the respective circuit boards, conductor land patterns provided with spacing therebetween along edges of the circuit boards, conductor terminals for interconnecting the conductor land patterns. The circuit boards are stacked with spacing therebetween with the corresponding conductor land patterns being aligned, and the aligned conductor land patterns are interconnected by the corresponding conductor terminals. At least one of the conductor terminals includes an interboard-connection portion for interconnecting the conductor land patterns of the circuit boards and a leg portion that extends from the interboard-connection portion in the stacking direction of the circuit boards and that defines an external-connection portion, and the other conductor terminals each function as an interboard-connection dedicated terminal for providing connection between the circuit boards.

20 Claims, 8 Drawing Sheets

SWITCHING POWER-SUPPLY MODULE

BACKGROUND OF THE INVENTION

1. Field of the Invention

The present invention relates to a switching power-supply module in which switching power-supply circuits, such as inverters or DC-DC converters, are provided on circuit boards.

2. Description of the Related Art

FIG. 8A is a schematic perspective view of one example of a switching power-supply module (e.g., Japanese Unexamined Patent Application Publication No. 2002-58247). In FIG. 8A, reference numeral 1 indicates a switching power-supply module and reference numeral 2 (2A and 2B) indicates circuit boards. Reference numeral 3 indicates electronic components mounted on the circuit boards 2 (2A and 2B). The electronic components 3 and wiring patterns (not shown) define switching power-supply circuits on the circuit boards 2 (2A and 2B).

Reference numeral 4 indicates conductor land patterns, which are provided at edges of the circuit boards 2 (2A and 2B). Reference numeral 5 indicates conductor terminals. As shown in the side view of FIG. 8B, each terminal 5 includes a plurality of clip portions 7 (7A and 7B) and a leg portion 8. The clip portions 7 (7A and 7B) are provided with spacing therebetween in the extending direction of the terminal 5, and the leg portion 8 is arranged so as to extend downward from the portions where the clip portions 7A and 7B are provided. The clip portions 7 (7A and 7B) of the terminals 5 clamp the edges of the formation portions of the conductor land patterns 4 of the circuit boards 2 (2A and 2B), such that the circuit boards 2A and 2B can be stacked with spacing therebetween. That is, the upper portion of each terminal 5, i.e., the portion where the clip portions 7 (7A and 7B) are provided, functions as an interboard-connection portion for interconnecting the corresponding conductor land patterns 4 of the circuit boards 2A and 2B. The tip portions of the leg portions 8 of the terminals 5 can also be connected to a motherboard 10, thereby mounting the circuit boards 2 (2A and 2B) on the motherboard 10.

In addition, at least one of the conductor land patterns 4 provided on each of the circuit boards 2A and 2B is connected to the switching power-supply circuit provided on the circuit board 2. The terminals 5 connect the switching power-supply circuits, provided on the circuit boards 2A and 2B, to an external circuit, provided on the motherboard 10, via the corresponding conductor land patterns 4. That is, the leg portion 8 of each terminal 5 functions as an external-connection portion for connecting the switching power-supply circuits, provided on the circuit boards 2A and 2B, to an external circuit.

For example, the switching power-supply circuit of the circuit board 2A and the switching power-supply circuit of the circuit board 2B have the same circuit configuration. The conductor land pattern 4 connected to an input portion of the switching power-supply circuit of the circuit board 2A and the conductor land pattern 4 connected to an input portion of the switching power-supply circuit of the circuit board 2B are interconnected by the corresponding terminal 5. Similarly, the conductor land pattern 4 connected to an output portion of the switching power-supply circuit of the circuit board 2A and the conductor land pattern 4 connected to an output portion of the switching power-supply circuit of the circuit board 2B are interconnected by the corresponding terminal 5. As a result, the switching power-supply circuit of the circuit board 2A and the switching power-supply circuit of the circuit board 2B are connected in parallel, such that the switching power-supply circuits operate in parallel.

With the switching power-supply module 1 as described above, the circuit boards 2A and 2B on which the switching power-supply circuits are provided are stacked one on the other with spacing therebetween using the terminals 5, such that the switching power-supply circuits on the circuit boards 2A and 2B operate in parallel. This arrangement, for example, increases the output power without increasing an area occupied for the switching power-supply circuits on the motherboard 10.

For example, when the upper limit of an area occupied for the switching power-supply circuits on the motherboard 10 is specified, configuring the switching power-supply module 1 using a plurality of stacked circuit boards increases the circuit-board surface area, as compared to a when only one circuit board is used. An increase in the surface area of the circuit boards facilitates heat dissipation of components mounted on the circuit boards.

Additionally, for example, wherein the switching power-supply module 1 must have an output power of 20 W, when a switching power-supply circuit having an output power of 10 W is already designed, stacking two switching power-supply circuits each having the output power of 10 W provides the switching power-supply module 1 having the required output power of 20 W. This reduces the time and effort required for the design.

In the switching power-supply module 1 shown in FIGS. 8A and 8B, all of the terminals 5 have external connection functions. Thus, this must be considered when designing the circuits of the switching power-supply module 1, and thus, the design freedom of circuit design decreases due to the external connection functions provided for all the terminals 5.

In the manufacturing process of the switching power-supply module 1, after the circuit boards 2A and 2B including the switching power-supply circuits are combined using the terminals 5, the circuit operations of the switching power-supply circuits are inspected for the presence or absence of abnormalities. Thus, not only when both of the switching power-supply circuits are defective but also when one of them is defective and the other is normal, the switching power-supply module 1 is regarded as being defective and is discarded. That is, even a normal switching power-supply circuit may be discarded, which is economically disadvantageous.

In addition, in the inspection process of the switching power-supply module 1, where the switching power-supply module 1 malfunctions and an abnormal portion causing the malfunction is detected, when the abnormal portion is located on, for example, the lower circuit board 2B, it is very difficult to repair the abnormal portion because the lower circuit board 2B is covered by the upper circuit board 2A. Thus, in such a case, the circuit boards 2A and 2B must be disassembled so that the lower circuit board 2B can be repaired, but such a process greatly increases the required time and effort.

SUMMARY OF THE INVENTION

To overcome the problems described above, preferred embodiments of the present invention provide a switching power-supply module that easily improves the freedom of circuit design, and a switching power-supply module that reduces the number of switching power-supply circuits that are wastefully discarded.

One preferred embodiment of the present invention provides a switching power-supply module. The switching power-supply module includes circuit boards, power conversion circuit sections provided on the respective circuit boards, conductor land patterns provided with spacing therebetween along edges of the circuit boards, and conductor terminals for interconnecting the conductor land patterns. The circuit boards are stacked with spacing therebetween with the formation positions of the corresponding conductor land patterns being aligned, and the aligned conductor land patterns are interconnected by the corresponding conductor terminals. At least one of the conductor terminals has an interboard-connection portion for interconnecting the conductor land patterns of the circuit boards and includes a leg portion that extends from the interboard-connection portion in a stacking direction of the circuit boards and that defines an external-connection portion, thereby functioning as an interboard-connection/external-connection terminal for providing connection between the circuit boards and for providing external connection. Each conductor terminal other than the at least one conductor terminal functions as an interboard-connection dedicated terminal for providing connection between the circuit boards.

Another preferred embodiment of the present invention provides a switching power-supply module. The switching power-supply module includes circuit boards, power conversion circuit sections provided on the circuit boards, conductor land patterns provided with spacing therebetween along edges of the circuit boards, and conductor terminals. The circuit boards are stacked with spacing therebetween with the formation positions of the conductor land patterns being aligned and ends of the conductor terminals are connected to the corresponding conductor land patterns so as to extend in a direction that is substantially perpendicular to major surfaces of the circuit boards. The conductor terminals of the upper circuit board in the stack are spliced to the corresponding conductor terminals of the lower circuit board and the spliced portions are joined to define joined terminals. At least one of the joined terminals has an interboard-connection portion for interconnecting the conductor land patterns of the circuit boards and has an external-connection portion extending from the interboard-connection portion in a stacking direction of the circuit boards, thereby functioning as an interboard-connection/external-connection terminal for providing connection between the circuit boards and for providing external connection. Each remaining joined terminal functions as an interboard-connection dedicated terminal for providing connection between the circuit boards.

According to preferred embodiments of the present invention, since the circuit boards having the power conversion circuit sections are stacked with spacing therebetween, the power output from the switching power-supply module is greatly increased without increasing a mounting area occupied on a motherboard. Also, when the upper limit of an area required on the motherboard is specified, preferred embodiments of the present invention increase the circuit-board surface area by stacking the plurality of circuit boards, as compared to an arrangement in which only one circuit board is used to define a switching power-supply module. This arrangement greatly increases heat dissipation of components.

In addition, since not only the interboard-connection/external-connection terminals but also the interboard-connection dedicated terminals are provided, the design freedom is greatly improved. This decreases the time and effort required for the design, which reduces the cost of the switching power-supply module. In addition, this arrangement eliminates a connection, while needed only between the circuit boards, that is provided for the outside, and thus, improves the electrical characteristic of the switching power-supply module.

Further, since the interboard-connection dedicated terminals are provided, the switching power-supply module may have many different circuit configurations. Thus, for example, a circuit configuration in which all or a portion of at least one of the input-side rectifier smoothing circuit section and the output-side rectifier smoothing circuit section is common to a plurality of power conversion circuit sections or a circuit configuration in which the control circuit section and the semiconductor switch are common to circuits of a plurality of circuit boards can also be used. With such a circuit configuration, at least one of the circuit boards that are stacked has a simplified circuit configuration in which the common circuit portion is omitted, thereby reducing the number of components. This arrangement, therefore, reduces the cost of switching power-supply module.

Further, for example, multiple types of circuits, each being capable of operating as a switching power-supply circuit even independently and having different output power, may be provided on respective circuit boards. In this case, varying a combination of the circuit boards that are stacked and connecting the switching power-supply circuits on the circuit boards in parallel simplifies and facilitates the fabrication of multiple types of switching power-supply modules having different output powers. This greatly improves design efficiency.

The semiconductor switches of the circuit boards may perform the switching operations at the same switching frequency and at different phases from each other. This arrangement reduced input feedback noise and output ripple voltages of the switching power-supply circuits that are DC-DC converters.

Circuits on the circuit boards may have the same circuit configuration. This arrangement eliminates the need for preparing multiple types of circuit boards, and thus, greatly improved the efficiency of circuit design and reduced maintenance cost of the circuit boards. This arrangement further prevents the circuit boards from being incorrectly combined in the manufacturing process.

The terminals preferably include clip portions that clamp the edges of the circuit boards. This arrangement simplifies and facilitates the connection between the terminals and the circuit boards, which thereby improves manufacturing efficiency. The terminals preferably include bent tip portions with surfaces for surface-mount. This arrangement facilitates mounting of the switching power-supply module on a mother board.

Additionally, the switching power-supply module preferably includes a configuration in which the ends of the terminals are connected to the conductor land patterns at the edges of the circuit boards, and the terminals of the upper circuit board in the stack and the terminals of the lower circuit board are joined. This arrangement enables the circuit boards to be individually inspected to check the circuit operations. For example, in a conventional inspection in which the circuit operations are inspected after a plurality of circuit boards are stacked and combined together, when an abnormality exists in the circuit operation of even one of the stacked circuit boards, all of the combined circuit boards must be discarded, which is economically inefficient, even when the combined circuit boards include a circuit board having a normal circuit. Also, when a portion causing an abnormal circuit operation is found by inspection, in some cases, the abnormal portion may be repaired. In such a case, when the abnormality exists on the lower circuit board in the stack, it is difficult to repair the abnormal portion because the lower circuit board is covered by the upper circuit board. Thus, the abnormal portion must be repaired after the switching power-supply module is disassembled into the individual circuit boards, which greatly increases the required time and effort. In contrast, according to preferred embodiments of the present invention, since circuit boards are individually inspected to check the circuit operations thereof, waste is eliminated and repair is facilitated.

Additionally, the terminals of the upper circuit board in the stack and the terminals of the lower circuit board are preferably joined by soldering or spot welding. This arrangement greatly improves the connection reliability between the terminals.

Other features, elements, characteristics, steps and advantages of the present invention will become more apparent from the following detailed description of preferred embodiments with reference to the attached drawings.

DETAILED DESCRIPTION OF PREFERRED EMBODIMENTS

Preferred embodiments of the present invention will be described below with reference to the accompanying drawings.

Figure 1:
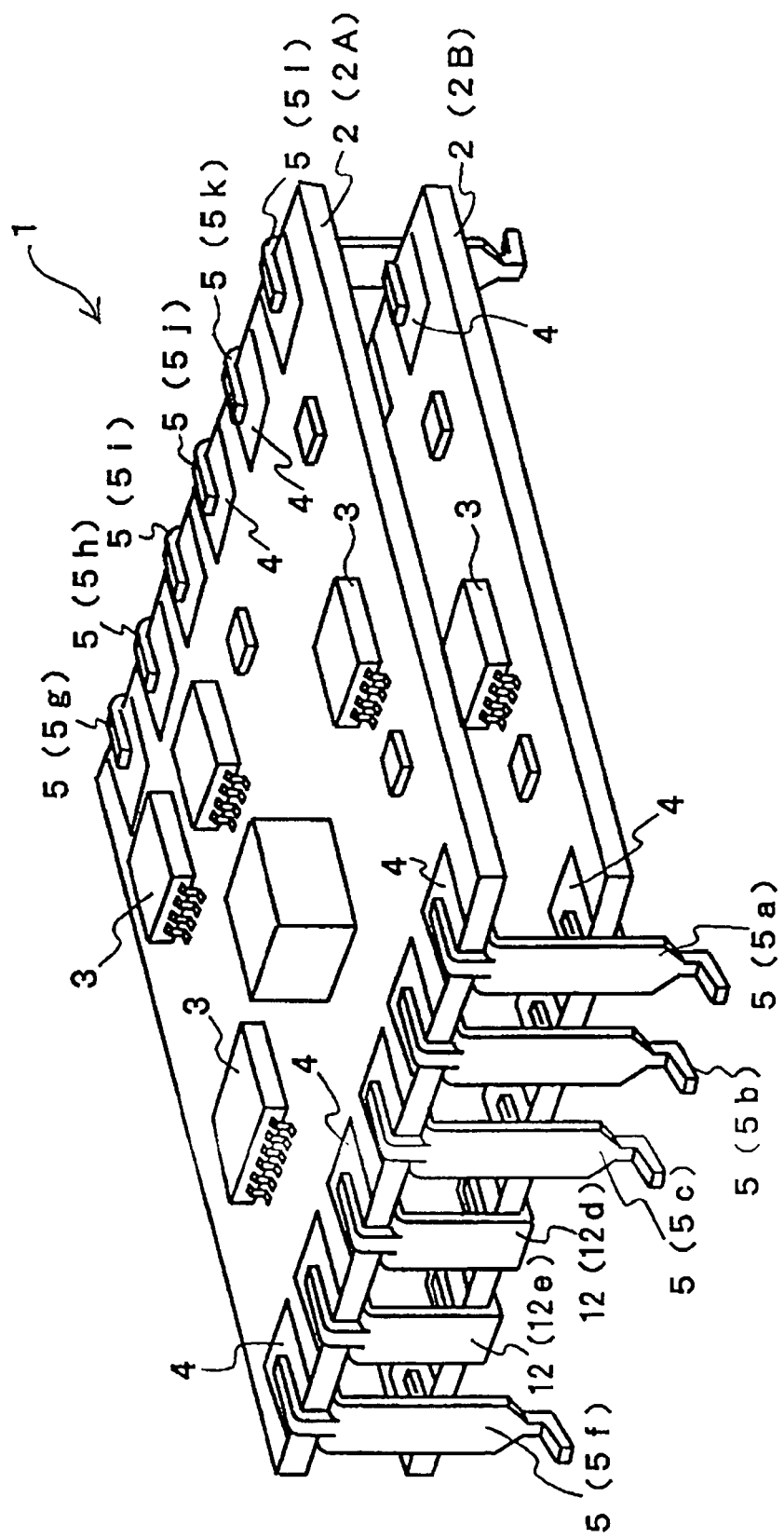
FIG. 1 is a perspective view of a switching power-supply module according to a first preferred embodiment of the present invention.
Figure 2:
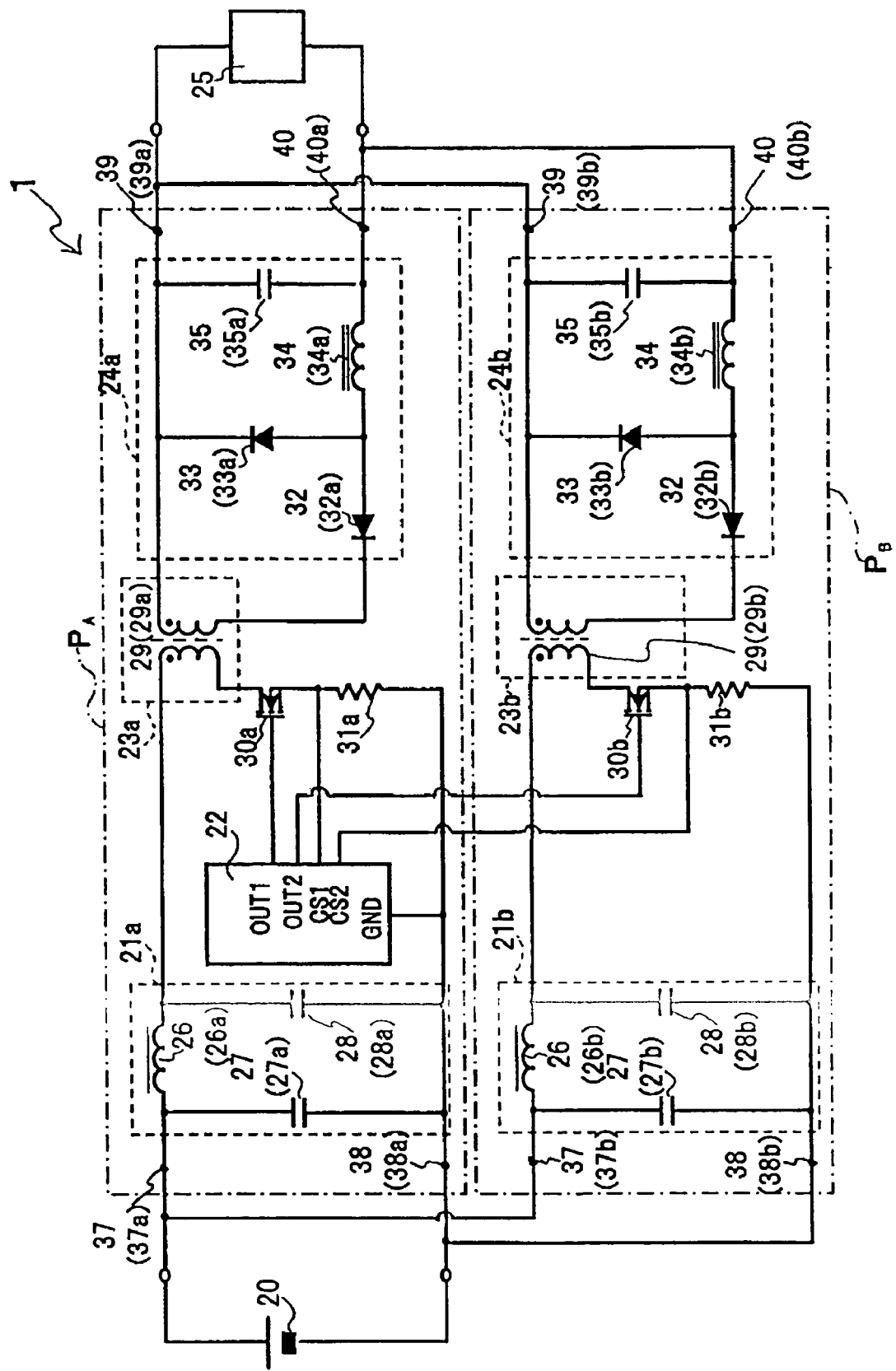
FIG. 2 is a circuit diagram of the switching power-supply module according to the first preferred embodiment of the present invention.
Figure 3:
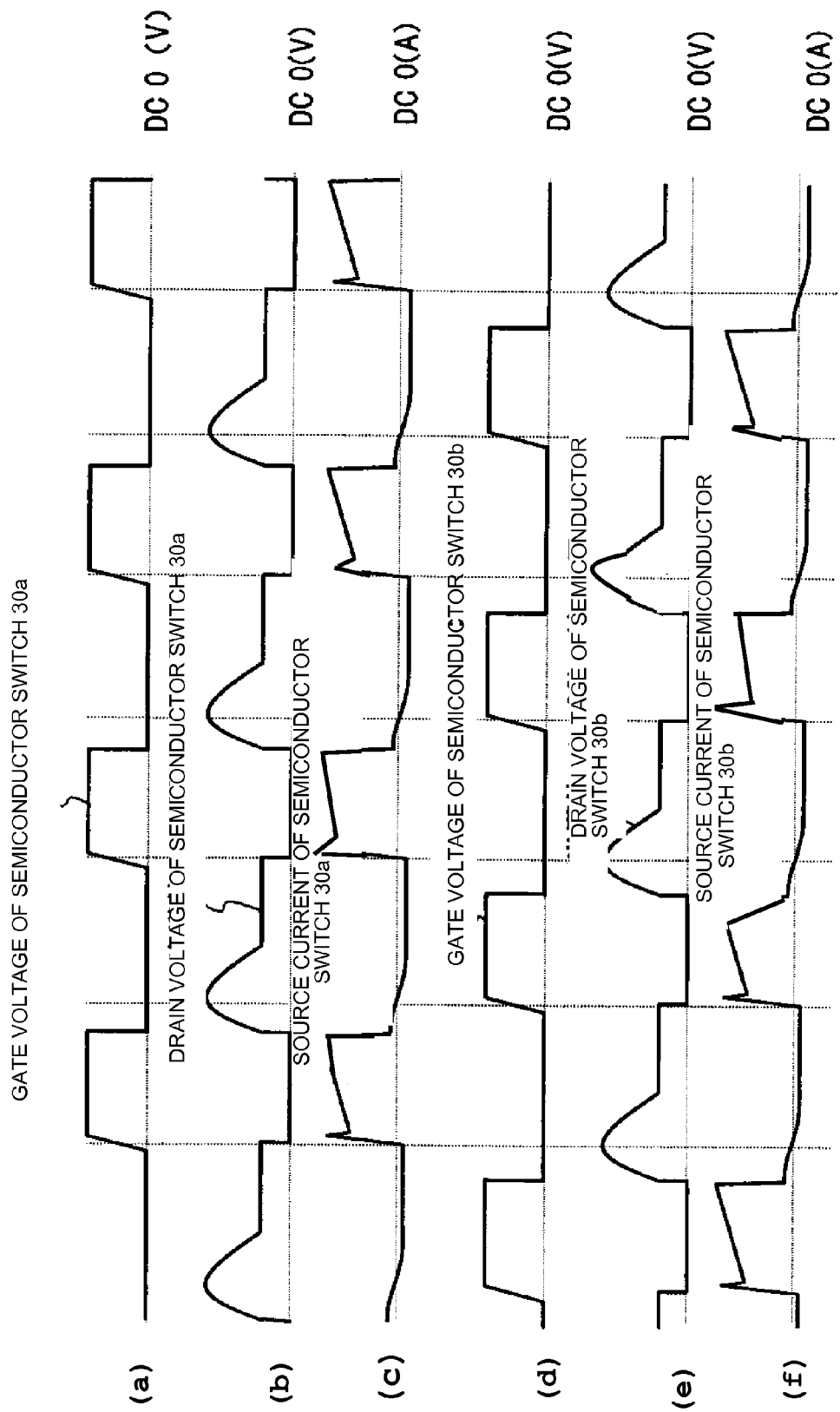
FIG. 3 shows exemplary waveforms of operations of major circuit sections of switching power-supply circuits provided in the switching power-supply module of the first preferred embodiment of the present invention.
Figure 8A:
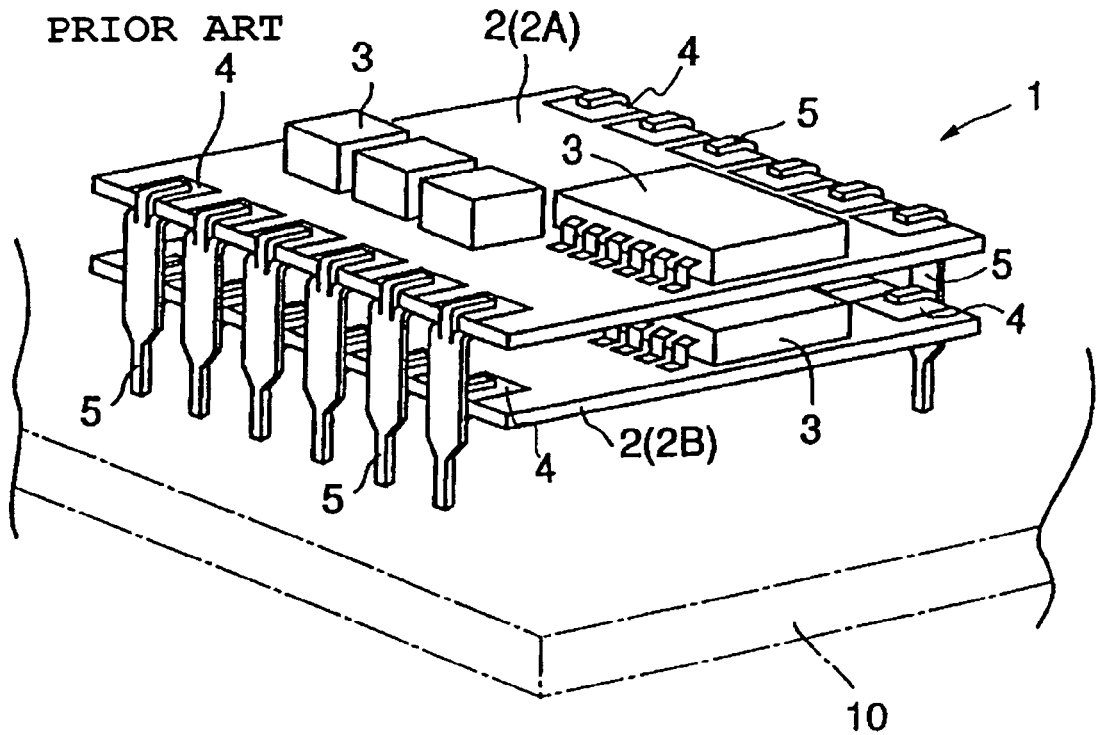
FIGS. 8A and 8B are schematic views for explaining an example of a switching power-supply module.

FIG. 1 is a schematic perspective view of a switching power-supply module according to a first preferred embodiment of the present invention. FIG. 2 is a schematic circuit diagram of the switching power-supply module of the first preferred embodiment. FIG. 3 shows exemplary waveforms of operations of major circuit sections of the switching power-supply module of the first preferred embodiment. In the following description of the first preferred embodiment, the same elements and portions as those in the switching power-supply module shown in FIGS. 8A and 8B are denoted with the same reference numerals and the descriptions thereof are omitted.

A switching power-supply module 1 of a first preferred embodiment includes a plurality of circuit boards 2 (2A and 2B). Along opposing edges of the circuit boards 2 (2A and 2B), a plurality of conductor land patterns 4 is arranged with spacing therebetween. The circuit boards 2A and 2B are stacked one on the other with spacing therebetween such that the formation positions of the conductor land patterns 4 are aligned. Two opposing conductor land patterns that are aligned with each other are interconnected by a corresponding conductor terminal 5 (5a, 5b, 5c, 5f, 5g, 5h, 5i, 5j, 5k or 5l) or a terminal 12 (12d or 12e).

Figure 8B:
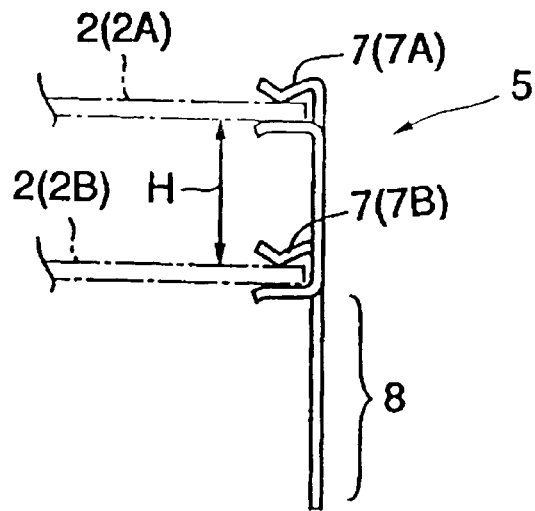

Each terminal 5 includes clip portions 7 (7A and 7B) and a leg portion 8 as shown in FIG. 8B. Each terminal 12 also includes clip portions that are similar to those of the terminal 5 except that the leg portion 8 is eliminated from the terminal 5. The clip portions 7 (7A and 7B) of the terminals 5 and 12 clamp the formation portions of the corresponding conductor land patterns 4 of the circuit boards 2 (2A and 2B). As a result, the terminals 5 and 12 hold the circuit boards 2 (2A and 2B) with spacing therebetween in a substantially parallel relationship and provide connection between the vertically-aligned conductor land patterns 4.

In each terminal 5, the tip portion of the leg portion 8 that extends from the clip portions 7 (7A and 7B) in the stacking direction of the circuit boards 2A and 2B is bent toward the outside of the switching power-supply module 1. The bottom surface of the bent tip portion of the leg portion 8 is disposed on, for example, a motherboard 10 by soldering or other suitable method. Thus, the surface of the bent tip portion of the leg portion 8 defines a surface for surface-mounting the switching power-supply module 1 on the motherboard 10, and the leg portion 8 functions as an external-connection portion for connecting the switching power-supply circuits provided on the circuit boards 2A and 2B, to a circuit of the motherboard 10.

As described above, each terminal 5 includes the clip portions 7 (7A and 7B) that function as an interboard-connection portion and also includes the leg portion 8 for external connection. That is, each terminal 5 functions as an interboard-connection/external-connection terminal that provides connection between the circuit boards 2A and 2B and that provides external connection. Each terminal 12, on the other and, performs no external connection function since the terminal 12 does not include the leg portion 8. Thus, each terminal 12 functions as merely an interboard-connection dedicated terminal, i.e., a terminal for providing connection between the circuit boards 2A and 2B.

Referring to FIG. 2 in which the circuit configuration of the switching power-supply module 1 of the first preferred embodiment is shown, a DC (direct current) input power supply 20 is connected to the switching power-supply module 1 and a load 25 is also connected to an output end of the switching power-supply module 1.

The switching power-supply module 1 of the first preferred embodiment includes two switching power-supply circuits $P_A$ and $P_B$. These switching power-supply circuits $P_A$ and $P_B$ are forward DC-DC converter circuits. Input ends of the switching power-supply circuits $P_A$ and $P_B$ are connected to the DC input power supply 20 and output ends of the switching power-supply circuits $P_A$ and $P_B$ are connected to the common load 25, such that the switching power-supply circuits $P_A$ and $P_B$ operate in parallel.

In the first preferred embodiment, the switching power-supply circuit $P_A$ is provided on the upper circuit board 2A in the stack shown in FIG. 1. Referring to FIG. 2, in the switching power-supply circuit $P_A$, reference numeral 21a indicates an input-side rectifier smoothing circuit section, 22 is a control circuit section, 23a is a power conversion circuit section, 24a is an output-side rectifier smoothing circuit section, 30a is a semiconductor switch, and 31a is a current detecting resistor. The switching power-supply circuit $P_B$, on the other hand, is provided on the lower circuit board 2B in the stack. In the switching power-supply circuit $P_B$, reference numeral 21b indicates an input-side rectifier smoothing circuit section, 23b is a power conversion circuit section, 24b is an output-side rectifier smoothing circuit section, 30b is a semiconductor switch, and 31b is a current detecting resistor.

The input-side rectifier smoothing circuit sections 21a and 21b of the switching power-supply circuits $P_A$ and $P_B$ have respective input π filter circuit configurations. The input-side rectifier smoothing circuit sections 21a and 21b include corresponding inductors 26 (26a and 26b) and corresponding capacitors 27 (27a and 27b) and 28 (28a and 28b). The power conversion circuit section 23a and 23b include transformers 29 (29a and 29b), respectively. The output-side rectifier smoothing circuit sections 24a and 24b include diodes 32 (32a and 32b), diodes 33 (33a and 33b), inductors 34 (34a and 34b), and capacitors 35 (35a and 35b), respectively.

In the first preferred embodiment, the control circuit section 22 is provided in only the switching power-supply circuit $P_A$ and is not provided in the switching power-supply circuit $P_B$. The control circuit section 22 thus defines a control circuit section that is common to the switching power-supply circuits $P_A$ and $P_B$. An output port OUT 1 of the control circuit section 22 is connected to the semiconductor switch 30a of the switching power-supply circuit $P_A$ to output a semiconductor-switch driving signal, while an output port OUT 2 of the control circuit section 22 is connected to the semiconductor switch 30b of the switching power-supply circuit $P_B$ to output a semiconductor-switch driving signal. Further, a current detecting port CS1 of the control circuit section 22 is connected to one end of the current detecting resistor 31a of the switching power-supply circuit $P_A$ to detect switching current, while a current detecting port CS2 of the control circuit section 22 is connected to one end of the current detecting resistor 31b of the switching power-supply circuit $P_B$ to detect switching current. Reference character GND shown in the control circuit section 22 indicates a ground connection portion.

Input portions 37 (37a and 37b) of the respective switching power-supply circuits $P_A$ and $P_B$ of the circuit boards 2A and 2B are connected to the conductor land patterns 4 located at the same position of the circuit boards 2. Similarly, input portions 38 (38a and 38b) of the switching power-supply circuits $P_A$ and $P_B$ are connected to the conductor land patterns 4 located at the same position of the circuit boards 2. For example, the input portions 37a and 37b are connected to the corresponding common terminal 5 (e.g., the terminal 5b shown in FIG. 1) via the corresponding conductor land patterns 4, and similarly, the input portions 38a and 38b are connected to the corresponding common terminal 5 (e.g., the terminal 5c) via the conductor land patterns 4. The input portions 37 (37a and 37b) and the input portions 38 (38a and 38b) are connected to external circuits.

Similarly, output portions 39 (39a and 39b) of the switching power-supply circuits $P_A$ and $P_B$ of the circuit boards 2A and 2B are connected to the corresponding conductor land patterns 4 located at the same position of the circuit boards 2, and output portions 40 (40a and 40b) of the switching power-supply circuits $P_A$ and $P_B$ of the circuit boards 2A and 2B are connected to the corresponding conductor land patterns 4 located at the same position of the circuit boards 2. The output portions 39 (39a and 39b) are interconnected by the corresponding terminal 5 via the corresponding conductor land patterns 4 and the output portions 40 (40a and 40b) are interconnected by the corresponding terminal 5 via the corresponding conductor land patterns 4. Further, the interconnected output portions 39 (39a and 39b) and the output portions 40 (40a and 40b) are connected to a circuit on the motherboard. In this case, the output portions 39 and 40 are connected to the terminals 5 on a one to one basis. Alternatively, for example, the arrangement may be such that the output portions 39 (39a and 39b) are connected to a plurality of terminals 5g, 5h and 5i shown in FIG. 1 and the output portions 40 (40a and 40b) are connected to a plurality of terminals 5j, 5k, and 5l, in order to reduce power loss caused by the resistance of the output ends.

In the first preferred embodiment, the output port OUT2 of the control circuit section 22 provided on the circuit board 2A and the semiconductor switch 30b provided on the circuit board 2B are connected to the conductor land patterns 4 located at the same location of the circuit boards 2A and 2B. The conductor land patterns 4 that are located at the same location are interconnected by one of the terminals 12 to thereby provide connection between the output port OUT2 of the control circuit section 22 and the semiconductor switch 30b. Similarly, the current detecting port CS2 of the control circuit section 22 of the circuit board 2A and the current detecting resistor 31b of the circuit board 2B are connected to the conductor land patterns 4 located at the same location of the circuit boards 2A and 2B. The conductor land patterns 4 that are located at the same location are interconnected by another terminal 12 to thereby provide connection between the current detecting port CS2 of the control circuit section 22 and the current detecting resistor 31b.

In this case, it is sufficient that the conductor land patterns 4 connected to the control circuit section 22 of the circuit board 2A and the conductor land patterns 4 connected to the semiconductor switch 30b and the current detecting resistor 31b of the circuit board 2B are interconnected between the circuit boards 2A and 2B. Thus, the conductor land patterns 4 are not connected to the outside. If the conductor land patterns 4 are connected to the outside, a problem could arise. In view of this situation, in the first preferred embodiment, the connections between the control circuit section 22 of the circuit board 2A and the semiconductor switch 30b and the current detecting resistor 31b of the circuit board 2B are made by the interboard-connection dedicated terminals 12 (e.g., the terminals 12d and 12e shown in FIG. 1).

An example of the circuit operation of the switching power-supply module 1 of the first preferred embodiment shown in FIG. 2 will now be described with reference to the waveform diagrams shown in FIG. 3. For example, DC power input from the DC input power supply 20 is applied to the transformers 29a and 29b of the power conversion circuit sections 23a and 23b via the input π filters of the input-side rectifier smoothing circuit sections 21a and 21b. By using switching operations of the semiconductor switches 30a and 30b, the transformers 29a and 29b convert the DC power input from the input-side rectifier smoothing circuit sections 21a and 21b into AC power and output the AC power. The output-side rectifier smoothing circuit sections 24a and 24b convert the AC power into DC power, which is then output to the load 25 from the switching power-supply module 1.

The switching power-supply circuits $P_A$ and $P_B$, which define the switching power-supply module 1 of the first preferred embodiment, perform a basic operation (DC-DC conversion operation) as described above, and, for example, a feedback circuit (not shown) detects a voltage output to the load 25, generates an error signal according to the difference between the detected voltage and a reference voltage, and feeds the error signal back to the control circuit section 22. In accordance with the feedback signal, the control circuit section 22 stabilizes a voltage to be output from the switching power-supply module 1 by modulating the pulse width of the switching-control driving signals to be applied to the semiconductor switches 30a and 30b.

In the first preferred embodiment, the driving signals that the control circuit section 22 applies to the gates of the semiconductor switches 30*a* and 30*b* have the same switching frequency but are 180° out of phase from each other, as indicated by waveforms (a) and (d) shown in FIG. 3. This inverted phase operation provides reduced input feedback noise and output ripple voltages.

Further, in the switching power-supply module 1 of the first preferred embodiment, the current detecting resistors 31*a* and 31*b* detect source currents of the semiconductor switches 30*a* and 30*b*, as indicated by waveforms (c) and (f) shown in FIG. 3, and the detected currents are input to the current detecting ports CS1 and CS2 of the control circuit section 22. In accordance with the source currents of the semiconductor switches 30*a* and 30*b* which are input to the current detecting ports CS1 and CS2, the control circuit section 22 indirectly detects respective currents output from the switching power-supply circuits $P_A$ and $P_B$. Using the detected currents, the control circuit section 22 performs control for balancing currents output from the switching power-supply circuits $P_A$ and $P_B$. With this control, the amount of current flowing through the switching power-supply circuits $P_A$ and $P_B$ is substantially equal, such that the heat generation of components of the switching power-supply circuits $P_A$ and $P_B$ are also substantially equal. In the switching power-supply module 1 of the first preferred embodiment, when an overcurrent flows through at least one of the switching power-supply circuits $P_A$ and $P_B$, the switching period of the semiconductor switch 30*a* or 30*b* of the switching power-supply circuit $P_A$ or $P_B$ through which the overcurrent flows is shortened so as to protect the circuits.

A second preferred embodiment will now be described. In the following description of the second preferred embodiment, the same elements and portions as those in the first preferred embodiment are denoted with the same reference numerals, and the descriptions thereof are omitted.

The switching power-supply module 1 according to a second preferred embodiment has a simplified circuit configuration. That is, as shown in the circuit diagram of FIG. 4, the switching power-supply circuit $P_A$ provided on the circuit board 2A includes the power conversion circuit section 23*a* and the output-side rectifier smoothing circuit section 24*a* but does not include an input-side rectifier smoothing circuit section, a control circuit section, and a semiconductor switch.

The switching power-supply circuit PB provided on the circuit board 2B includes an input-side rectifier smoothing circuit section 21, the control circuit section 22, the power conversion circuit section 23*b*, the output-side rectifier smoothing circuit section 24*b*, and a semiconductor switch 30. The input-side rectifier smoothing circuit section 21, the control circuit section 22, and the semiconductor 30 of the switching power-supply circuit $P_B$ are common to the switching power-supply circuits $P_A$ and $P_B$.

In the second preferred embodiment, the primary coil of the transformer 29*a* of the circuit board 2A and the primary coil of the transformer 29*b* of the circuit board 2B are connected in series by the corresponding conductor land patterns 4 and the corresponding interboard-connection dedicated terminal 12. The transformer 29*a* of the circuit board 2A is also connected to the input-side rectifier smoothing circuit section 21 of the circuit board 2B via another interboard-connection dedicated terminal 12.

In the second preferred embodiment, in accordance with the switching operation of the semiconductor switch 30, power is supplied to the series-connected portion, including the primary coils of the transformers 29*a* and 29*b*, via the input-side rectifier smoothing circuit section 21, and, in accordance with the supplied power, AC power is output from the transformers 29*a* and 29*b*. The power output from the transformer 29*a* is converted by the output-side rectifier smoothing circuit section 24*a* into direct current, which is then output as the output power of the switching power-supply circuit $P_A$. Similarly, the power output from the transformer 29*b* is converted by the output-side rectifier smoothing circuit section 24*b* into direct current, which is then output as the output power of the switching power-supply circuit $P_B$. The sum of the powers output from the switching power-supply circuits $P_A$ and $P_B$ is supplied to the load 25. In the second preferred embodiment, in the output-side rectifier smoothing circuit sections 24*a* and 24*b*, synchronous rectifiers 42 (42*a* and 42*b*) and 43 (43*a* and 43*b*), which are controlled by synchronous-rectifier driving circuit sections 44 (44*a* and 44*b*), perform rectifying operations, unlike the first preferred embodiment in which the diodes 32 and 33 perform rectifying operations.

In the second preferred embodiment, for example, a feedback circuit (not shown) detects a voltage output from the switching power-supply circuit $P_B$, as in the first preferred embodiment. In accordance with the detected voltage, the control circuit section 22 controls the switching operation of the semiconductor switch 30 to stabilize the voltage output from the switching power-supply module 1. Further, an overcurrent detecting circuit (not shown) for detecting an overcurrent is provided. Thus, when the overcurrent detecting circuit detects an overcurrent, for example, the ON period of the semiconductor switch 30 is shortened, thereby performing a protection operation against the overcurrent.

A third preferred embodiment will now be described. In the following description of the third preferred embodiment, the same elements and portions as those in the first and second preferred embodiments are denoted with the same reference numerals, and the descriptions thereof are omitted.

Figure 5A:
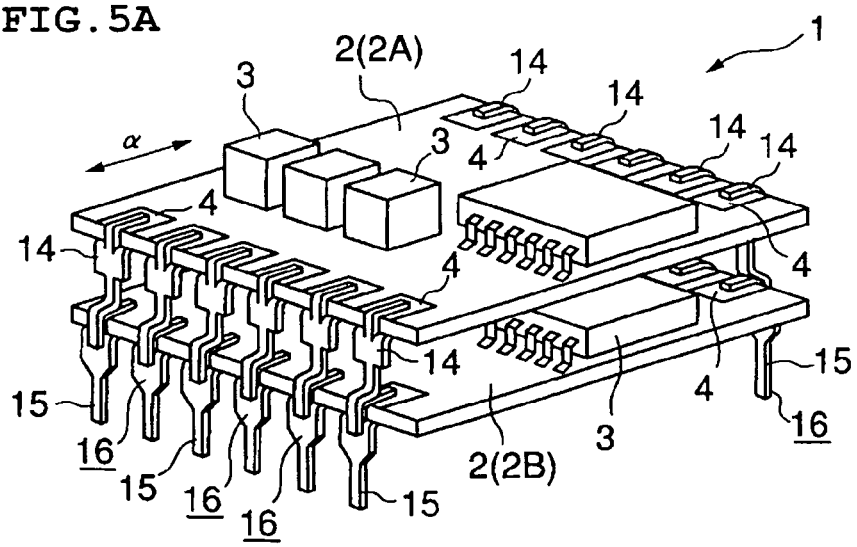
FIGS. 5A, 5B, and 5C are perspective views for explaining a switching power-supply module according to a third preferred embodiment of the present invention.
Figure 5B:
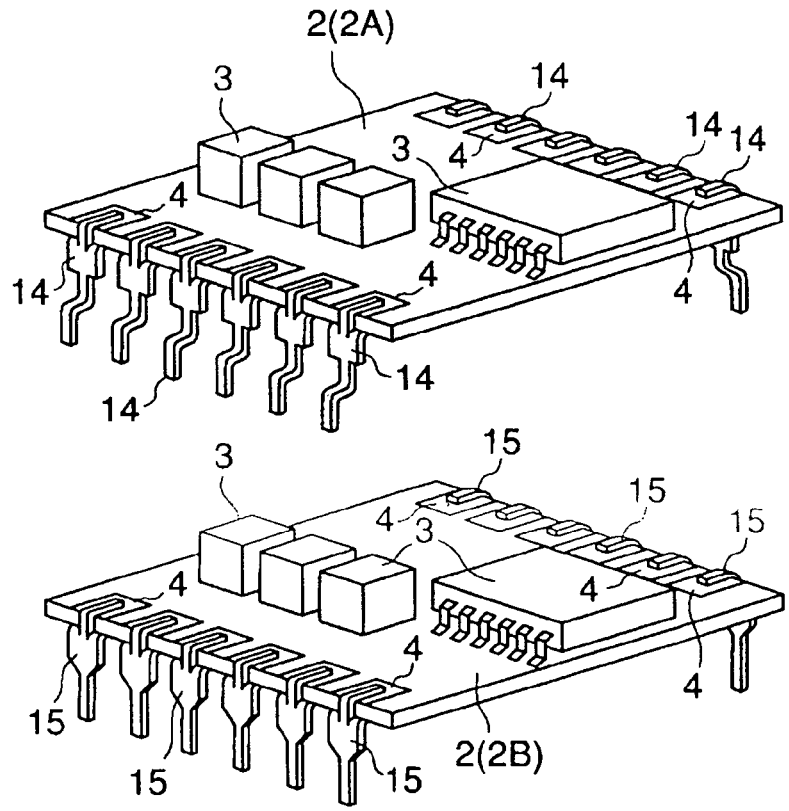

FIG. 5A is a perspective view of a switching power-supply module of a third preferred embodiment and FIG. 5B is an exploded perspective view of the switching power-supply module thereof. The switching power-supply module 1 of the third preferred embodiment includes a plurality of circuit boards 2 (2A and 2B). Switching power-supply circuits having the same configuration (which is similar to that of, for example, the switching power-supply circuit $P_A$ shown in FIG. 2) are provided on the respective circuit boards 2A and 2B.

Ends of terminals 14 are connected to the respective conductor land patterns 4 located at edges of the circuit board 2A, and ends of terminals 15 are connected to the respective conductor land patterns 4 located at edges of the circuit board 2B.

Figure 5C:
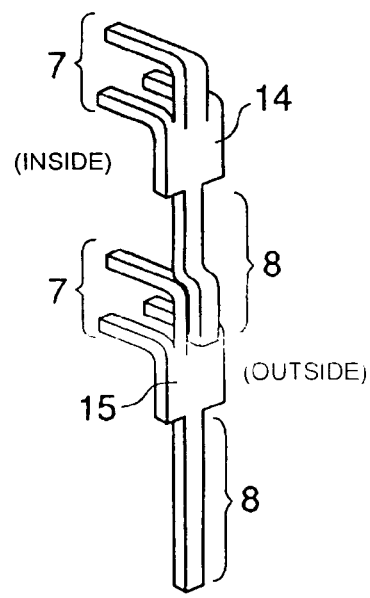

As show in the enlarged view of FIG. 5C, in the third preferred embodiment, the terminals 14 and 15 are provided with respective clip portions 7, which are similar to the clip portions 7 of the terminals 5 and 12 in the first and second preferred embodiments. The clip portions 7 clamp the formation portions of the conductor land patterns 4 of the circuit boards 2 from two opposite sides, thereby connecting the terminals 14 and 15 to the circuit boards 2. The terminals 14 and 15 further include respective leg portions 8 extending from the clip portions 7 in a direction perpendicular to the major surfaces of the circuit boards 2. The leg portions 8 of the terminals 14 are bent. Specifically, the leg portion 8 of each terminal 14 is bent such that, when the clip portions 7 of the terminals 14 and 15 are vertically aligned and arranged, the inner portion of the leg portion 8 of the terminal 14, i.e., the portion adjacent to the circuit boards 2, fits along the outer portion of the terminal 15.

In the third preferred embodiment, the circuit boards 2 (2A and 2B) are stacked one on the other with spacing therebetween, as in the first and second preferred embodiments. The leg portions 8 of the terminals 14 of the upper circuit board 2A in the stack are spliced to the corresponding terminals 15 of the lower circuit board 2B, and the spliced portions are joined by soldering, spot welding, or other suitable method, thereby defining joined terminals 16. The circuit boards 2A and 2B are combined by the joined terminals 16.

If the leg portion 8 of each terminal 14 is straight, when the circuit boards 2A and 2B are stacked one on the other and the leg portions 8 of the terminals 14 are spliced to the corresponding terminals 15, the terminals 14 tend to be displaced outward from the terminals 15 by an amount corresponding to the thickness of the conductor plate of the terminals 14 and 15. With such an arrangement, therefore, the upper circuit board 2A is easily displaced relative to the lower circuit board 2B in direction a shown in FIG. 5A. In contrast, in the third preferred embodiment, since the leg portions 8 of the terminals 14 are bent as described above, for example, the circuit board 2B to which the terminals 15 are connected is disposed, with almost no gap, between the leg portions 8 of the terminals 14 (shown in FIG. 5B) connected at two opposite edges of the circuit board 2A. This prevents the circuit boards 2A and 2B from being displaced from each other in direction α. In addition, the terminals 14 are positioned relative to the terminals 15 while the bent portions of the leg portions 8 of the terminals 14 are engaged with the top portions of the clip portions 7 of the terminals 15. The arrangement of the third preferred embodiment, therefore, facilitates stacking of the circuit boards 2A and 2B one on the other with a spacing therebetween.

In the third preferred embodiment, not all the joined terminals 16 function in the same manner as the interboard-connection external-connection terminal 5 as shown in the first and second preferred embodiments, but at least one of the joined terminals 16 functions in the same manner as the interboard-connection dedicated terminal 12. That is, the joined terminal 16 that functions as the interboard-connection dedicated terminal, for example, is configured in which the tip portion thereof is bent so as to be out of contact with the motherboard or is configured such that the tip portion is in contact with an insulating-material portion or the like of the motherboard.

The switching power-supply module 1 of the third preferred embodiment is configured as described above. In the manufacturing process of the switching power-supply module 1 of the third preferred embodiment, for example, first, electronic components 3 are mounted on the circuit boards 2 to define switching power-supply circuits. Subsequently, the terminals 14 (15) are attached to the conductor land patterns 4 of the corresponding circuit board 2.

The circuit boards 2 are then individually inspected to check whether or not the circuits operate properly. When a malfunctioning circuit operation is discovered on the individual circuit boards 2, a defective circuit thereon is repaired or the circuit board is discarded if the circuit board cannot be repaired.

After the inspection of the circuit operation, the leg portions 8 of the terminals 14 that are attached to the circuit board 2A are bent and then the circuit boards 2 (2A and 2B) are stacked while the formation positions of the corresponding conductor land patterns 4 are aligned. At this point, the terminals 14 of the upper circuit board 2A in the stack are spliced to the outsides of the corresponding terminals 15 of the circuit board 2B. The spliced portions of the terminals 14 and 15 are joined by soldering, spot welding, or other suitable method, thereby completing the assembly of the circuit boards 2A and 2B.

In this manufacturing process, the circuit operation of each individual circuit board 2 is inspected. Thus, after the plurality of circuit boards 2 is assembled into the switching power-supply module 1, no inspection is required for the circuit operation thereof.

If the circuit operations of the individual circuit boards 2 are inspected after the circuit boards 2 are assembled into the switching power-supply module 1, when even one of the circuit boards 2, which define the switching power-supply module 1, is detected as being abnormal, complicated work is required. That is, the switching power-supply module 1 from which the abnormality is detected must be disassembled into the individual circuit boards 2 such that the defective circuit board 2 can be repaired or discarded, and then the circuit boards 2 must be re-assembled into the switching power-supply module 1. In contrast, in the third preferred embodiment, since the circuit boards 2 are individually inspected to check the circuit operations, only the circuit board 2 from which the abnormality is detected is repaired or discarded. This eliminates the need to disassemble the switching power-supply module 1 and re-assemble the circuit boards 2, thereby greatly increasing productivity.

In addition, since the terminals 14 and 15, each including the clip portion 7, are off-the-shelf components and thus are readily available, the third preferred embodiment provides an advantage in that it is not necessary to fabricate terminal components specifically for the switching power-supply module 1.

Additionally, for example, when the terminals 5, each including the plurality of clip portions 7, as shown in FIG. 8B, are used to assemble the circuit boards 2 into the switching power-supply module 1, a problem may arise. For example, after the connection portions between the clip portions 7 of the terminals 5 and the circuit boards 2 (conductor land patterns 4) are dipped in and removed out of a solder bath to solder the clip portions 7 to the circuit boards 2, molten solder drops from the upper circuit board 2 (2A) to the lower circuit board 2 (2B) via the terminals 5. As a result, for example, on the lower circuit board 2 (2B), a solder bridge caused by the dropped solder may form between adjacent terminals 5 (clip portions 7) and/or between adjacent conductor land patterns 4, thereby causing a short between the terminals 5. In contrast, in the third preferred embodiment, since the terminals 14 and 15 are soldered for each circuit board 2, this problem is avoided.

The present invention is not limited to the disclosed first to third preferred embodiments, and can take various forms. For example, although the switching power-supply circuits having the DC-DC converter circuit configurations is disclosed in the first to third preferred embodiments by way of example, the switching power-supply circuits may have AC-input type circuit configurations or inverter circuit configurations.

Further, although each interboard-connection dedicated terminal 12 illustrated in the first and second preferred embodiments is adapted to connect a circuit section provided on one of the circuit boards 2A and 2B to a circuit section on the other circuit board, the interboard-connection dedicated terminal 12 may be designed to function as a terminal for providing communication between the switching power-supply circuits $P_A$ and $P_B$. Such an arrangement is applicable to a case, for example, in which, in response to a signal instructing a power-save mode is externally input, a portion of at least one of the switching power-supply circuits is put into a non-operating state to reduce the power consumption.

Figure 6A:
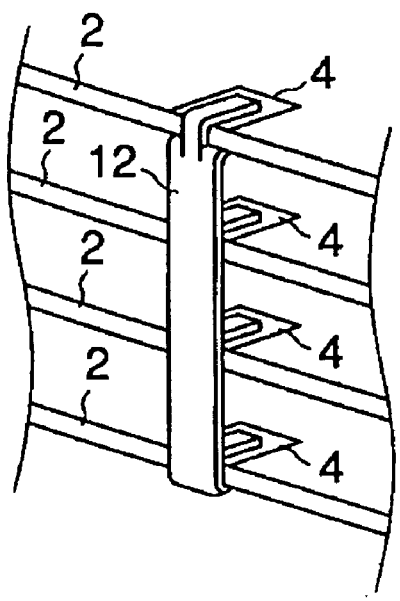
FIGS. 6A and 6B are schematic views illustrating other examples of connections between circuit boards using an interboard-connection dedicated terminal.
Figure 6B:
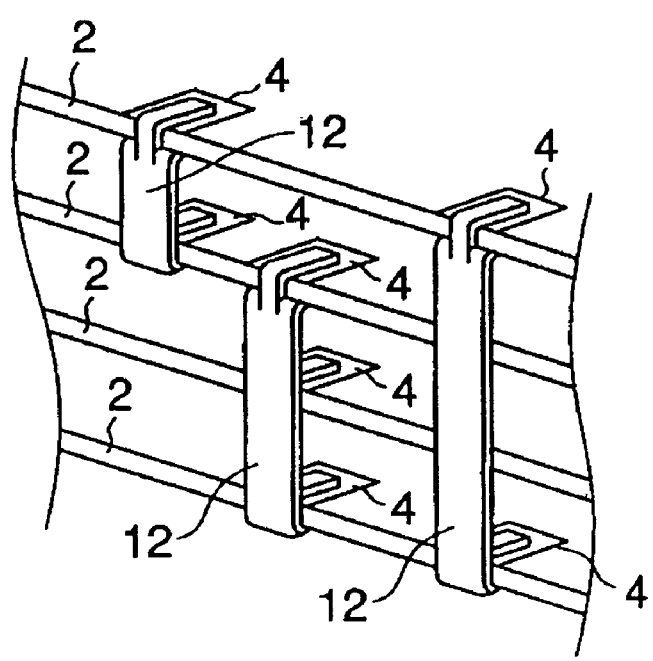

Additionally, although two circuit boards 2A and 2B are stacked in the first to third preferred embodiments, for example, three or more circuit boards 2 may be stacked. In such a case, for example, the interboard-connection dedicated terminal(s) 12 may be configured to connect all the stacked circuit boards 2, as shown in FIG. 6A, or may alternatively be configured to connect two or more circuit boards selected among the stacked circuit boards 2, as shown in FIG. 6B.

Figure 7:
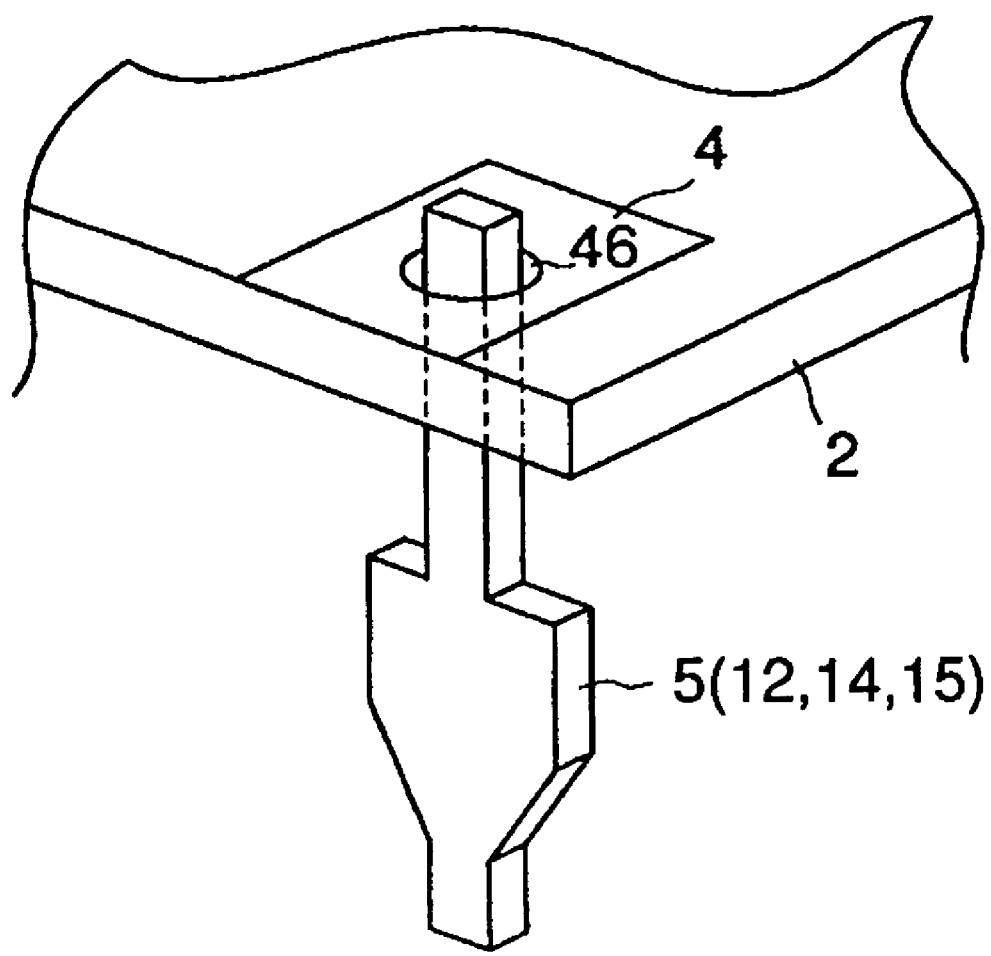
FIG. 7 is a schematic view illustrating another example of the terminal.

Further, although each terminal 5, 12, 14, or 15 illustrated in the first to third preferred embodiments includes the clip portion(s), for example, a terminal 5 (12, 14, or 15) as shown in FIG. 7 may also be used for connection with the circuit board 2. With the terminal 5 (12, 14, or 15) shown in FIG. 7, it is inserted into a through hole 46 provided in the circuit board 2 and is joined to the conductor land pattern 4 via a joining method, such as soldering.

Also, in the first and second preferred embodiments, the switching power-supply circuit provided on at least one of the circuit boards 2 to be stacked has a simplified circuit configuration in which one or some of the circuit sections are not provided, and thus has a different circuit configuration from the other. However, all the circuit boards to be stacked may have the same circuit configuration. In addition, although all the circuit boards to be stacked have the same circuit configuration in the third preferred embodiment, for example, at least one of the circuit boards may have a simplified circuit configuration in which one or some of the circuit sections are omitted, as in the first and second preferred embodiments.

Additionally, although the input-side rectifier smoothing circuit section 21 is common to the power conversion circuit sections 23a and 23b in the second preferred embodiment, for example, an output-side rectifier smoothing circuit section, as well as the input-side rectifier smoothing circuit section 21, may also be common to the power conversion circuit sections 23a and 23b. In this manner, when the input-side rectifier smoothing circuit section 21 and the output-side rectifier smoothing circuit section 21 are both shared, for example, the power conversion circuit section 23a, the semiconductor switch 30a, and the input-side rectifier smoothing circuit section 21 are provided on the circuit board 2A, and the power conversion circuit section 23b, the semiconductor switch 30b, and the output-side rectifier smoothing circuit section 24 are provided on the circuit board 2B. The output end of the power conversion circuit section 23a of the circuit board 2A is then connected to the output-side rectifier smoothing circuit section 24 provided on the circuit board 2B via, for example, one of the interboard-connection dedicated terminals 12, and the input end of the power conversion circuit section 23b of the circuit board 2B is connected to the input-side rectifier smoothing circuit section 21 provided on the circuit board 2A via, for example, another interboard-board dedicated terminals 12. With this arrangement, the circuit boards 2 is miniaturized as compared to the configurations illustrated in the first and second preferred embodiments.

Further, when the input-side rectifier smoothing circuit section 21 or the output-side rectifier smoothing circuit section 24 is shared as described above, a portion of the input-side rectifier smoothing circuit section 21 or a portion of the output-side rectifier smoothing circuit section 24 may be shared rather than the entire circuit section thereof.

Also, in the first preferred embodiment, although the semiconductor switches 30a and 30b are switched by the control circuit section 22 at the same switching frequency but at different phases, the switching operation is not limited thereto. For example, the semiconductor switches 30a and 30b may be switched at the same switching frequency and at the same phase.

In addition, although the bent tip portion of each terminal 5 for connecting the switching power-supply module 1 to, for example, the motherboard 10 includes the surface for surface-mount, a different type of terminal 5 may be used. For example, the arrangement may be such that the tip portion of the terminal 5 is inserted into a hole provided in the motherboard 10 and is connected thereto by soldering.

In the second preferred embodiment, although the primary coils of the transformers provided in the power conversion circuit sections are connected in series, the primary coils may be connected in parallel.

Figure 4:
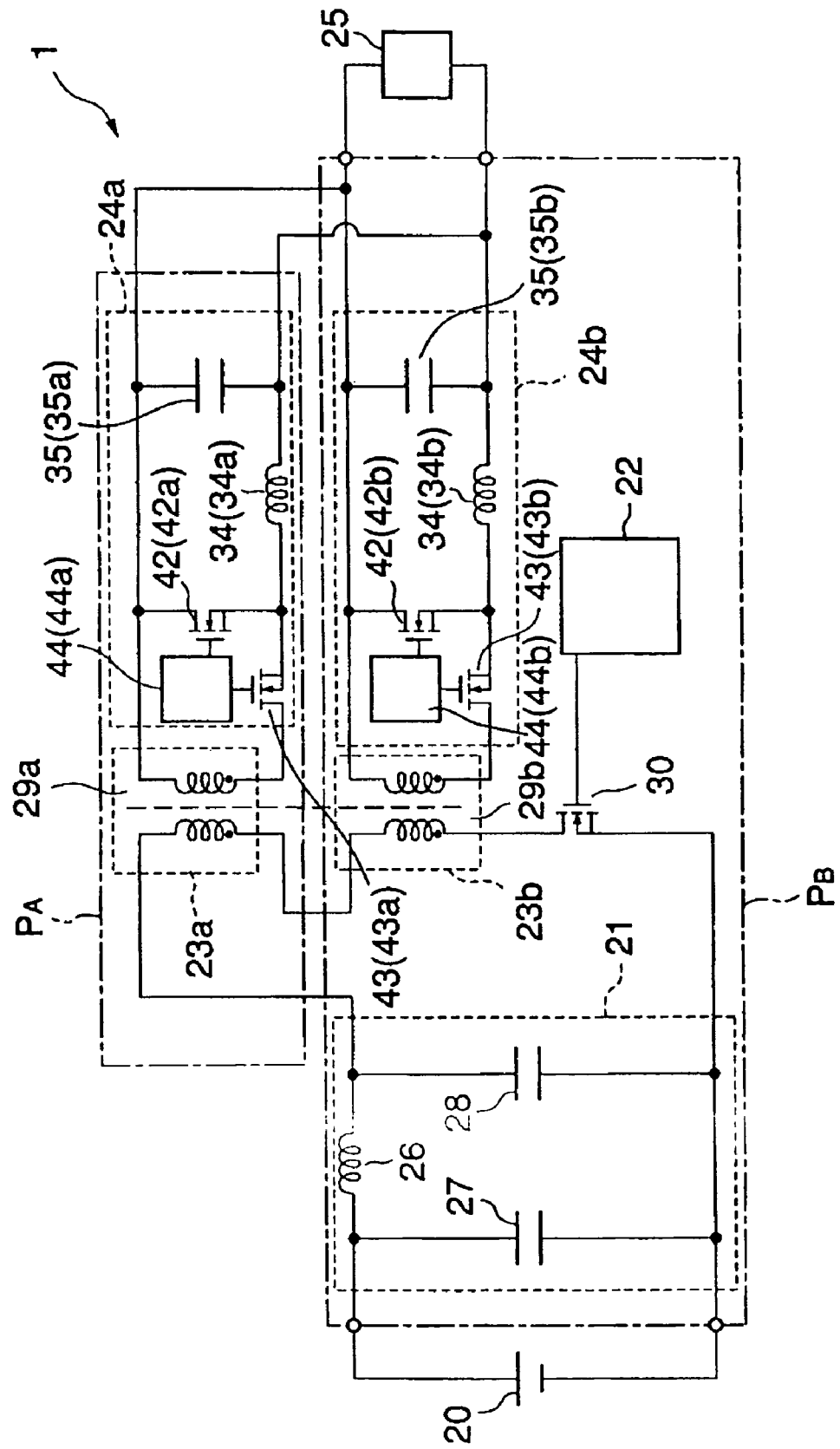
FIG. 4 is a circuit diagram of a second preferred embodiment of the present invention.

Additionally, in the first to third preferred embodiments, although the power conversion circuit sections include transformers, the power conversion circuit sections may include, for example, inductors instead of the transformers. Further, the circuit configurations of the input-side rectifier smoothing circuit section(s) and the output-side rectifier smoothing circuit sections are not limited to what are shown in FIGS. 2 and 4, and thus can have various configurations. In addition, although the illustrated switching power-supply circuits have the configuration for overcurrent protection and the configuration for balancing output currents, they are provided as needed and thus do not necessarily have to be provided.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A switching power-supply module, comprising:
   circuit boards;
   power conversion circuit sections provided on the respective circuit boards;
   conductor land patterns provided with spacing therebetween along edges of the circuit boards; and
   conductor terminals interconnecting the conductor land patterns; wherein
   the circuit boards are stacked with spacing therebetween such that the conductor land patterns are aligned, and the aligned conductor land patterns are interconnected by the corresponding conductor terminals; and
   at least one of the conductor terminals includes an interboard-connection portion interconnecting the conductor land patterns of the circuit boards and a leg portion that extends from the interboard-connection portion in a stacking direction of the circuit boards and that defines an external-connection portion thereby defining an interboard-connection/external-connection terminal arranged to provide connection between the circuit boards and to provide external connection, and each conductor terminal other than the at least one conductor terminal defines an interboard-connection dedicated terminal arranged to provide connection between the circuit boards.

2. A switching power-supply module according to claim 1, wherein the power conversion circuit sections have input portions that are connected to the conductor land patterns located at the same location of the circuit boards, the conductor land patterns to which the input portions are connected are interconnected by the at least one interboard-connection/external-connection terminal, whereby the input portions are connected to the outside via the at least one interboard-connection/external-connection terminal.

3. A switching power-supply module according to claim 2, wherein the power conversion circuit sections include output portions that are connected to the conductor land patterns located at the same location of the circuit boards, the conductor land patterns to which the output portions are connected are interconnected by another interboard connection/external-connection terminal, whereby the output portions of the power conversion circuit sections are connected to the outside via the another interboard connection/external-connection terminal, such that the power conversion circuit sections are connected in parallel.

4. A switching power-supply module according to claim 1, wherein the circuit boards include respective circuits having the same circuit configuration.

5. A switching power-supply module according to claim 1, further comprising:
   at least one semiconductor switch arranged to perform a switching operation;
   an input-side rectifier smoothing circuit section that is provided on one of the circuit boards and that is connected to an input end of the power conversion circuit sections via the semiconductor switch;
   at least one output-side rectifier smoothing circuit section that is connected to output ends of the power conversion circuit sections; and
   a control circuit section; wherein
   in accordance with the switching operation of the semiconductor switch, the power conversion circuit sections output alternating current power in response to power input via the input-side rectifier smoothing circuit section, the output-side rectifying smoothing circuit section converts the alternating current power into direct current and outputs the direct current to the outside, and the control circuit section controls the switching operation of the semiconductor switch to stabilize a voltage of the output direct current to a predetermined voltage; and
   at least a portion of at least one of the input-side rectifier smoothing circuit section and the output-side rectifier smoothing circuit section defines a circuit portion that is common to the power conversion circuit sections and another circuit board on which the common circuit portion is not provided includes a circuit that has a simplified circuit configuration in which the common circuit portion is omitted and that is connected to the common circuit portion via one of the interboard-connection dedicated terminals so as to complement the omitted circuit portion.

6. A switching power-supply module according to claim 5, wherein at least two of the circuit boards include the respective power conversion circuit sections, each having a transformer with a primary coil, the primary coils being connected in series or in parallel by at least one of the interboard-connection dedicated terminals, and wherein one of the at least two circuit boards includes the semiconductor switch and the control circuit section which are common to the power conversion circuit sections having the connected primary coils, and an input end of the power conversion circuit section of each circuit board other than the circuit board including the semiconductor switch and the control circuit section is connected to the common semiconductor switch via one of the interboard-connection dedicated terminals.

7. A switching power-supply module according to claim 5, wherein each of the circuit boards has the power conversion circuit section and the semiconductor switch, and the semiconductor switches of the circuit boards perform the switching operations at the same switching frequency and at different phases from each other in accordance with a control operation of the control circuit section.

8. A switching power-supply module according to claim 1, further comprising:
   semiconductor switches arranged to perform switching operations;
   input-side rectifier smoothing circuit sections that are connected to input ends of the power conversion circuit sections via the respective semiconductor switches;
   output-side rectifier smoothing circuit sections that are connected to output ends of the power conversion circuit sections; and
   a control circuit section that is provided on one of the circuit boards and that is connected via one of the interboard-connection dedicated terminals to the semiconductor switch of another circuit board having a simplified circuit configuration in which the control circuit section is not provided, the control circuit section being common to the semiconductor switches of the circuit boards; wherein
   in accordance with the switching operation of each semiconductor switch, the corresponding power conversion circuit section outputs alternating current power in response to power input via the corresponding input-side rectifier smoothing circuit section, the corresponding output-side rectifying smoothing circuit section converts the alternating current power into direct current and outputs the direct current to the outside, and the control circuit section controls the switching operation of each semiconductor switch to stabilize a voltage of the output direct current to a predetermined voltage.

9. A switching power-supply module according to claim 8, wherein at least two of the circuit boards include the respective power conversion circuit sections, each having a transformer with a primary coil, the primary coils being connected in series or in parallel by at least one of the interboard-connection dedicated terminals, and wherein one of the at least two circuit boards includes the semiconductor switch and the control circuit section which are common to the power conversion circuit sections having the connected primary coils, and an input end of the power conversion circuit section of each circuit board other than the circuit board including the semiconductor switch and the control circuit section is connected to the common semiconductor switch via one of the interboard-connection dedicated terminals.

10. A switching power-supply module according to claim 8, wherein each of the circuit boards has the power conversion circuit section and the semiconductor switch, and the semiconductor switches of the circuit boards perform the switching operations at the same switching frequency and at different phases from each other in accordance with a control operation of the control circuit section.

11. A switching power-supply module according to claim 1, wherein the switching power-supply module is a DC-DC converter.

12. A switching power-supply module according to claim 1, wherein each of said interboard-connection/external-connection terminals and each of said interboard-connection dedicated terminals includes at least one clip portion for clamping an edge of each circuit board from two opposite sides thereof, thereby connecting the circuit boards.

13. A switching power-supply module according to claim 1, wherein a tip portion of the leg portion of each of said interboard-connection/external-connection terminals is bent to define a surface for surface-mounting.

14. A switching power-supply module, comprising:
   circuit boards;
   power conversion circuit sections provided on the circuit boards;
   conductor land patterns provided with spacing therebetween along edges of the circuit boards; and
   conductor terminals; wherein the circuit boards are stacked with spacing therebetween with the corresponding conductor land patterns being aligned, ends of the conductor terminals are connected to the corresponding conductor land patterns so as to extend in a direction that is substantially perpendicular to major surfaces of the circuit boards, and the conductor terminals of the upper circuit board in the stack are spliced to the corresponding conductor terminals of the lower circuit board and the spliced portions are joined to define joined terminals; and at least one of the joined terminals includes an interboard-connection portion interconnecting the conductor land patterns of the circuit boards and an external-connection portion extending from the interboard-connection portion in a stacking direction of the circuit boards, thereby defining an interboard-connection/external-connection terminal arranged to provide connection between the circuit boards and to provide external connection, and each remaining joined terminal defines an interboard-connection dedicated terminal arranged to provide connection between the circuit boards.

15. A switching power-supply module according to claim 14, wherein the spliced portions are joined by one of a solder joint and a spot welded joint.

16. A switching power-supply module according to claim 14, wherein the switching power-supply module is a DC-DC converter.

17. A switching power-supply module according to claim 14, further comprising:

at least one semiconductor switch arranged to perform a switching operation;

an input-side rectifier smoothing circuit section that is provided on one of the circuit boards and that is connected to an input end of the power conversion circuit sections via the semiconductor switch;

at least one output-side rectifier smoothing circuit section that is connected to output ends of the power conversion circuit sections; and a control circuit section; wherein in accordance with the switching operation of the semiconductor switch, the power conversion circuit sections output alternating current power in response to power input via the input-side rectifier smoothing circuit section, the output-side rectifying smoothing circuit section converts the alternating current power into direct current and outputs the direct current to the outside, and the control circuit section controls the switching operation of the semiconductor switch to stabilize a voltage of the output direct current to a predetermined voltage; and at least a portion of at least one of the input-side rectifier smoothing circuit section and the output-side rectifier smoothing circuit section defines a circuit portion that is common to the power conversion circuit sections and another circuit board on which the common circuit portion is not provided includes a circuit that has a simplified circuit configuration in which the common circuit portion is omitted and that is connected to the common circuit portion via one of the interboard-connection dedicated terminals so as to complement the omitted circuit portion.

18. A switching power-supply module according to claim 17, wherein each of the circuit boards has the power conversion circuit section and the semiconductor switch, and the semiconductor switches of the circuit boards perform the switching operations at the same switching frequency and at different phases from each other in accordance with a control operation of the control circuit section.

19. A switching power-supply module according to claim 14, further comprising:

semiconductor switches arranged to perform switching operations;

input-side rectifier smoothing circuit sections that are connected to input ends of the power conversion circuit sections via the respective semiconductor switches;

output-side rectifier smoothing circuit sections that are connected to output ends of the power conversion circuit sections; and a control circuit section that is provided on a predetermined one of the circuit boards and that is connected via one of the interboard-connection dedicated terminals to the semiconductor switch of another circuit board having a simplified circuit configuration in which the control circuit section is not provided, the control circuit section being common to the semiconductor switches of the circuit boards; wherein in accordance with the switching operation of each semiconductor switch, the corresponding power conversion circuit section outputs alternating current power in response to power input via the corresponding input-side rectifier smoothing circuit section, the corresponding output-side rectifying smoothing circuit section converts the alternating current power into direct current and outputs the direct current to the outside, and the control circuit section controls the switching operation of each semiconductor switch to stabilize a voltage of the output direct current to a predetermined voltage.

20. A switching power-supply module according to claim 19, wherein at least two of the circuit boards include the respective power conversion circuit sections, each having a transformer with a primary coil, the primary coils being connected in series or in parallel by at least one of the interboard-connection dedicated terminals, and wherein one of the at least two circuit boards includes the semiconductor switch and the control circuit section which are common to the power conversion circuit sections having the connected primary coils, and an input end of the power conversion circuit section of each circuit board other than the circuit board including the semiconductor switch and the control circuit section is connected to the common semiconductor switch via one of the interboard-connection dedicated terminals.

* * * * *